(12) United States Patent
Cheng et al.

(10) Patent No.: US 9,947,548 B2
(45) Date of Patent: Apr. 17, 2018

(54) SELF-ALIGNED SINGLE DUMMY FIN CUT WITH TIGHT PITCH

(71) Applicant: International Business Machines Corporation, Armonk, NY (US)

(72) Inventors: Kangguo Cheng, Schenectady, NY (US); Cheng Chi, Jersey City, NJ (US); Chi-chun Liu, Altamont, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/231,979

(22) Filed: Aug. 9, 2016

(65) Prior Publication Data

US 2018/0047575 A1 Feb. 15, 2018

(51) Int. Cl.
*H01L 21/31* (2006.01)
*H01L 21/30* (2006.01)
*H01L 21/46* (2006.01)
*H01L 21/308* (2006.01)
*H01L 21/311* (2006.01)

(52) U.S. Cl.
CPC .... *H01L 21/3085* (2013.01); *H01L 21/31116* (2013.01)

(58) Field of Classification Search
CPC .......... H01L 21/30; H01L 21/31; H01L 21/46
USPC ......... 438/700–703, 712, 724, 478; 257/327, 257/328, E21.68, E27.103, E29.302, 257/E29.306
See application file for complete search history.

(56) References Cited

U.S. PATENT DOCUMENTS

| | | | |
|---|---|---|---|
| 4,838,991 A | 6/1989 | Cote et al. | |
| 7,087,471 B2 | 8/2006 | Beintner | |
| 8,656,322 B1 | 2/2014 | Dechene et al. | |
| 8,859,433 B2 | 10/2014 | Abdallah et al. | |
| 9,107,291 B2 | 8/2015 | Cheng et al. | |
| 9,224,617 B2 | 12/2015 | Pritchard et al. | |
| 9,349,607 B1 | 5/2016 | Tung et al. | |
| 9,349,640 B1 | 5/2016 | Chang et al. | |
| 2008/0217292 A1* | 9/2008 | Millward | B82Y 30/00 216/46 |
| 2010/0243161 A1* | 9/2010 | Tran | H01L 21/0337 156/345.3 |
| 2012/0043646 A1* | 2/2012 | Kim | H01L 21/0337 257/618 |
| 2012/0164392 A1* | 6/2012 | Stoykovich | B81C 1/00031 428/172 |
| 2012/0282751 A1* | 11/2012 | Oh | H01L 21/0337 438/382 |

(Continued)

*Primary Examiner* — Sheikh Maruf
(74) *Attorney, Agent, or Firm* — Cantor Colburn LLP; Vazken Alexanian

(57) ABSTRACT

A method of forming a semiconductor device and resulting structures having a dummy semiconductor fin removed from within an array of tight pitch semiconductor fins by forming a first spacer including a first material on a substrate; forming a second spacer including a second material on the substrate, the second spacer adjacent to the first spacer; and applying an etch process to the first spacer and the second spacer; wherein the etch process removes the first spacer at a first etch rate; wherein the etch process removes the second spacer at a second etch rate; wherein the first etch rate is different than the second etch rate.

13 Claims, 20 Drawing Sheets

(56) References Cited

U.S. PATENT DOCUMENTS

| | | | |
|---|---|---|---|
| 2013/0309871 A1* | 11/2013 | DeVilliers | H01L 21/0273 438/703 |
| 2014/0138800 A1* | 5/2014 | He | H01L 29/02 257/632 |
| 2015/0243509 A1 | 8/2015 | Chan et al. | |
| 2016/0011516 A1* | 1/2016 | deVilliers | G03F 7/039 430/323 |
| 2016/0020110 A1* | 1/2016 | Lu | H01L 29/7848 257/618 |
| 2016/0111286 A1* | 4/2016 | Wen | H01L 21/0338 438/492 |
| 2016/0133477 A1* | 5/2016 | Trefonas, III | H01L 21/0273 257/618 |
| 2016/0139302 A1 | 5/2016 | Black et al. | |
| 2016/0181100 A1* | 6/2016 | deVilliers | H01L 21/0337 438/702 |

\* cited by examiner

SELF-ALIGNED SINGLE DUMMY FIN CUT WITH TIGHT PITCH

BACKGROUND

The present invention relates in general to semiconductor device fabrication methods and resulting structures. More specifically, the present invention relates to fabrication methods and resulting structures for a semiconductor device having a dummy semiconductor fin removed from within an array of tight pitch semiconductor fins.

In contemporary semiconductor device fabrication processes, a large number of semiconductor devices, such as fin field effect transistors (finFETs), are fabricated in and on a single wafer. FinFETs employ semiconductor fins to introduce on-wafer topography. The semiconductor fins are often formed as an array of semiconductor fins having a perodicity, or fin pitch, to minimize etch bias due to pattern factor, i.e., the fraction of the area of the semiconductor fins within a unit area. In this case, some of the semiconductor fins need to be removed after formation of the array of semiconductor fins to provide isolated semiconductor fins or a duster of semiconductor fins isolated from other clusters of semiconductor fins. The unwanted semiconductor fins are dummy fins.

SUMMARY

According to one or more embodiments of the present invention, a method of fabricating a semiconductor device having a dummy semiconductor fin removed from within an array of tight pitch semiconductor fins is provided. The method can include forming a first spacer including a first material on a substrate; forming a second spacer including a second material on the substrate, the second spacer adjacent to the first spacer; and applying an etch process to the first spacer and the second spacer; wherein the etch process removes the first spacer at a first etch rate; wherein the etch process removes the second spacer at a second etch rate; wherein the first etch rate is different than the second etch rate.

According to one or more embodiments of the present invention, a structure having a dummy semiconductor tin removed from within an array of tight pitch semiconductor fins is provided. The structure can include a first spacer having a first material formed on a substrate; and a second spacer having a second material formed on the substrate, the second spacer adjacent to the first spacer on the substrate; wherein an etch process applied to the first spacer removes the first spacer at a first etch rate; wherein the etch process applied to the second spacer removes the second spacer at a second etch rate; wherein the first etch rate is different than the second etch rate.

According to one or more embodiments of the present invention, a method of fabricating a semiconductor device is provided. The method can include forming a first spacer, a second spacer, and a third spacer on a substrate, the first spacer and the third spacer including a first material and the second spacer including a second material, the second spacer arranged between the first spacer and the third spacer; applying an etch process to the first spacer, the second spacer, and the third spacer; wherein the etch process removes the first spacer and the third spacer at a first etch rate; wherein the etch process removes the second spacer at a second etch rate; wherein the first etch rate is different than the second etch rate; wherein the etch process removes the second spacer to expose a portion of the substrate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
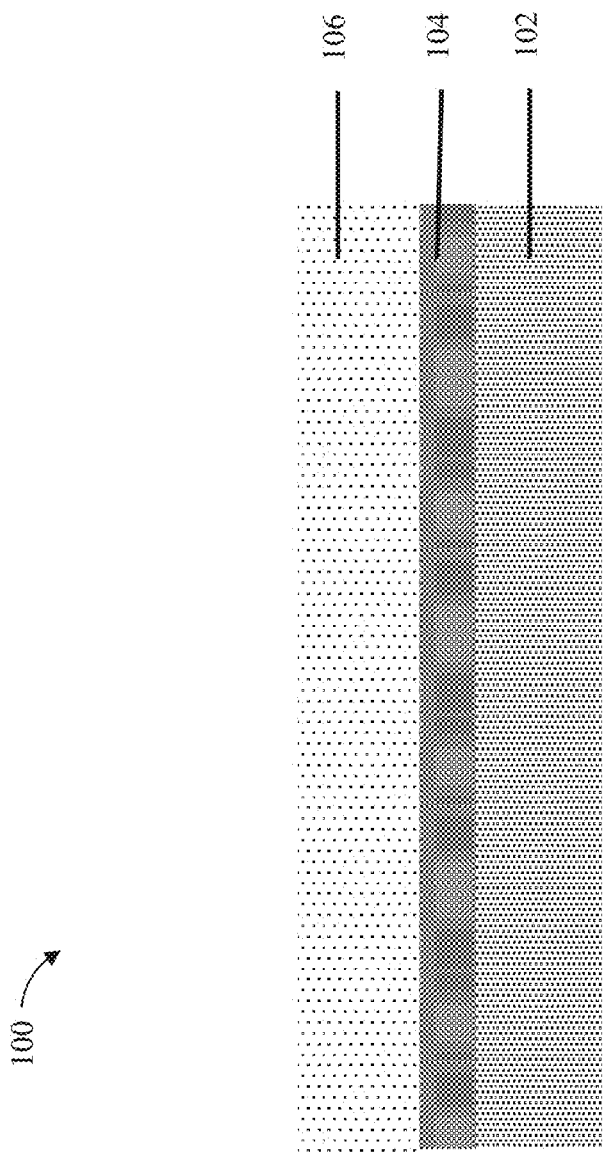
FIG. 1 depicts a cross-sectional view of a structure having a sacrificial layer deposited on a substrate according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy tin removed from within an array of tight pitch tins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, the fabrication of finFET semiconductor structures having a single dummy fin removed from within an array of tight pitch fins requires a lithographically patterned mask to physically expose the unwanted dummy semiconductor fin while covering and protecting the adjacent semiconductor fins. The lithographically patterned mask includes two sidewalls of a patterned photoresist that need to be positioned within the spaces between the single dummy semiconductor fin and the two adjacent semiconductor fins to ensure that only the single dummy fin is removed without removing any additional semiconductor fins. To improve device performance the semiconductor industry has repeatedly shrunk transistor gate lengths and chip sizes, increasing device density. As a consequence, fin pitch continues to shrink. Fin pitch refers to the centerline-to-centerline distance between adjacent fins. As fins are becoming closer to each other and it is becoming difficult to selectively cut a single unwanted dummy fin without compromising the adjacent device fins due to the overlay tolerances of lithographic processes. The overlay tolerances of available lithographic processes begin to limit the effective removal of a dummy fin as the fin pitch decreases in part because it is becoming increasingly difficult to precisely position the two photoresist sidewalls between adjacent fins.

Overlay error, or positioning errors, of a mask between features in the semiconductor structure can lead to reliability issues. Overlay errors result from misalignment during the lithography process as the mask invariably becomes mis-aligned with the underlying structure. To improve the manufacturability of lithography fabrication operations, advanced masks that incorporate phase-shifting and optical proximity correction have been employed. Although overlay errors can be mitigated by these advancements and by reworking the lithography operations, some level of overlay error is unavoidable. Thus, a method is desired for ensuring that only a single semiconductor fin can be removed from an array of tight pitch semiconductor fins while reliably protecting adjacent semiconductor fins.

One or more embodiments of the present invention provide methods of fabricating a semiconductor device having a single dummy semiconductor fin removed from within an array of tight pitch semiconductor fins. The described method employs a two color fin hard mask. The use of the term "color" herein does not refer to an actual color of the structure but refers instead to the material from which the structure is made. Thus, a two "color" fin hard mask is a patterned hard mask structure having a first fin hard mask of a first material (i.e., a first color) and a second fin hard mask of a second material (i.e., a second color), the first material selective to the second material. The second element includes an etch rate with respect to an etchant or an etch operation that is substantially lower than an etch rate of the first material with respect to the same etchant or etch operation. The first fin hard mask and the second fin hard mask each include one or more spacers. The two color fin hard mask is patterned such that, for any pair of adjacent spacers, one spacer is of the first material and the other spacer is of the second material (i.e., forming an alternating pattern of the spacers). The alternating patterning of the spacers, and thus, the first material and the second material, allows for the patterned photoresist sidewalls of a patterned mask to self-align to a dummy fin processing window that protects adjacent tins during the dummy fin etch. Methods for fabricating a two color fin hard mask for removing a single dummy fin and the resulting structures therefrom in accordance with embodiments of the present invention are described in detail below by referring to the accompanying drawings in FIGS. 1-20.

FIG. 1 illustrates a cross-sectional view of a structure 100 having a sacrificial layer 106 deposited on a substrate 102 during an intermediate operation of a method of fabricating a semiconductor device according to one or more embodiments. The sacrificial layer 106 can be of any suitable sacrificial material, such as, for example, silicon nitrides (SiN), amorphous carbon (aC), or an ashable material. Suitable ashable materials have physical properties that are sufficient to withstand exposure to etch processes needed for later mandrel formation, and the subsequent thermal processing (i.e., time and temperature) associated with deposition and etch processes needed for the formation of sidewall spacers. The sacrificial layer 106 can be formed using, for example, chemical vapor deposition (CVD), plasma enhanced chemical vapor deposition, atomic layer deposition, physical vapor deposition or a conformal deposition. The substrate 102 can be of any suitable substrate material such as, for example, monocrystalline Si, SiGe, SiC, or semiconductor-on-insulator (SOI). In some embodiments, a top layer of the substrate 102 can be Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. In some embodiments, a hard mask layer 104 is deposited on top of the substrate 102, the hard mask layer 104 between the substrate 102 and the sacrificial material layer 106. The hard mask layer 104 can be of any suitable material, such as amorphous carbon.

Figure 2:
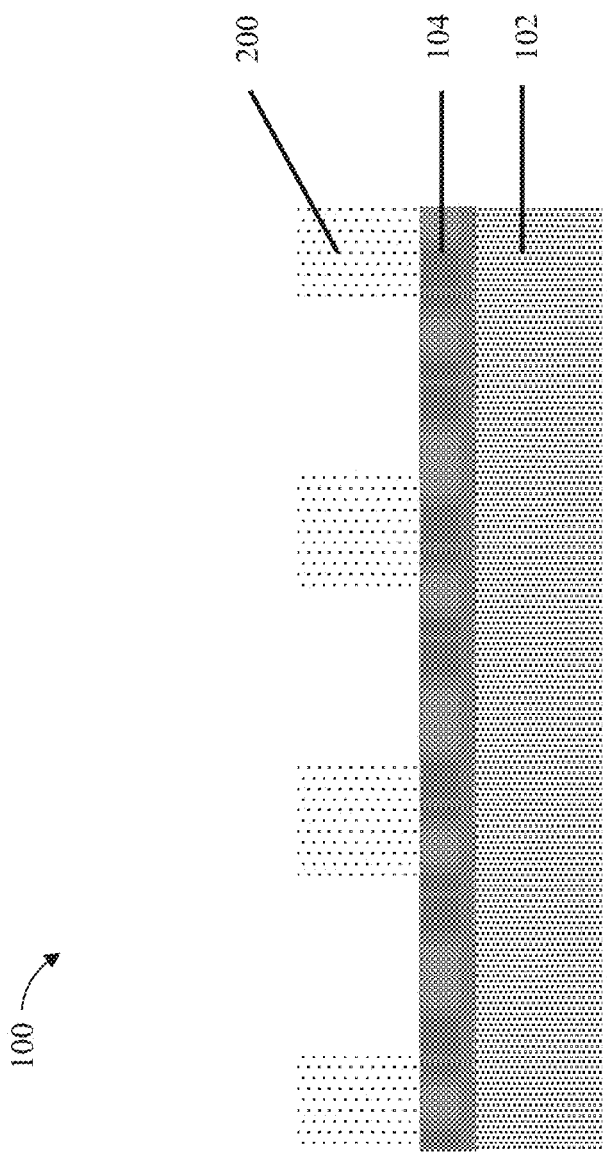
FIG. 2 depicts the cross-sectional view of the structure after patterning the sacrificial material layer to form sacrificial mandrels having sidewalls according to one or more embodiments of the present invention.

FIG. 2 illustrates a cross-sectional view of the structure 100 after patterning the sacrificial material layer 106 to form sacrificial mandrels 200 having sidewalls. For ease of illustration and description, only some of the sacrificial mandrels 200 are depicted. However, it is understood that two or more sacrificial mandrels 200 can be utilized. A variety of methods can be used to form the sacrificial mandrels 200. In some embodiments, trenches in the sacrificial layer 106 are formed using, for example, an anisotropic or dry etching technique, such as a reactive ion etching (ME). ME is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Figure 3:
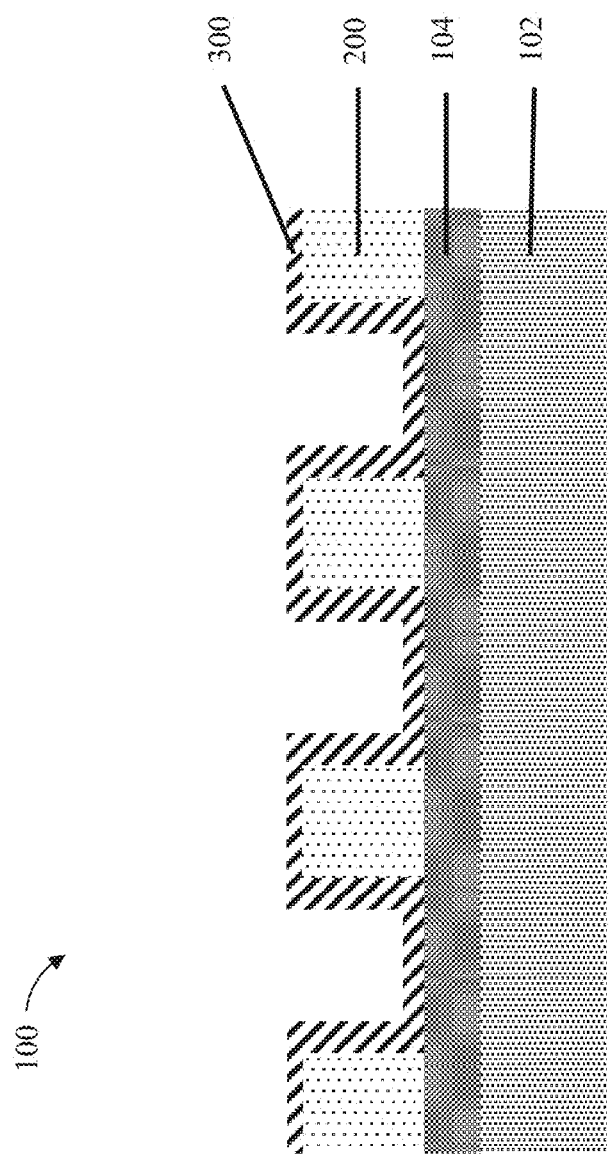
FIG. 3 depicts the cross-sectional view of the structure after depositing a conformal spacer layer over the sacrificial mandrels according to one or more embodiments of the present invention.

FIG. 3 illustrates a cross-sectional view of the structure 100 after depositing a conformal spacer layer 300 over the sacrificial mandrels 200. The conformal spacer layer 300 can be of any suitable material, such as, for example, an oxide, silicon dioxide, or silicon nitride. The manner of depositing the conformal spacer layer 300 is not meant to be particularly limited. In some embodiments, the conformal spacer layer 300 can be conformally formed using chemical vapor deposition (CVD), plasma-enhanced chemical vapor deposition (PECVD), atomic layer deposition (ALD), evaporation, physical vapor deposition (PVD), chemical solution deposition, or other like processes.

Figure 4:
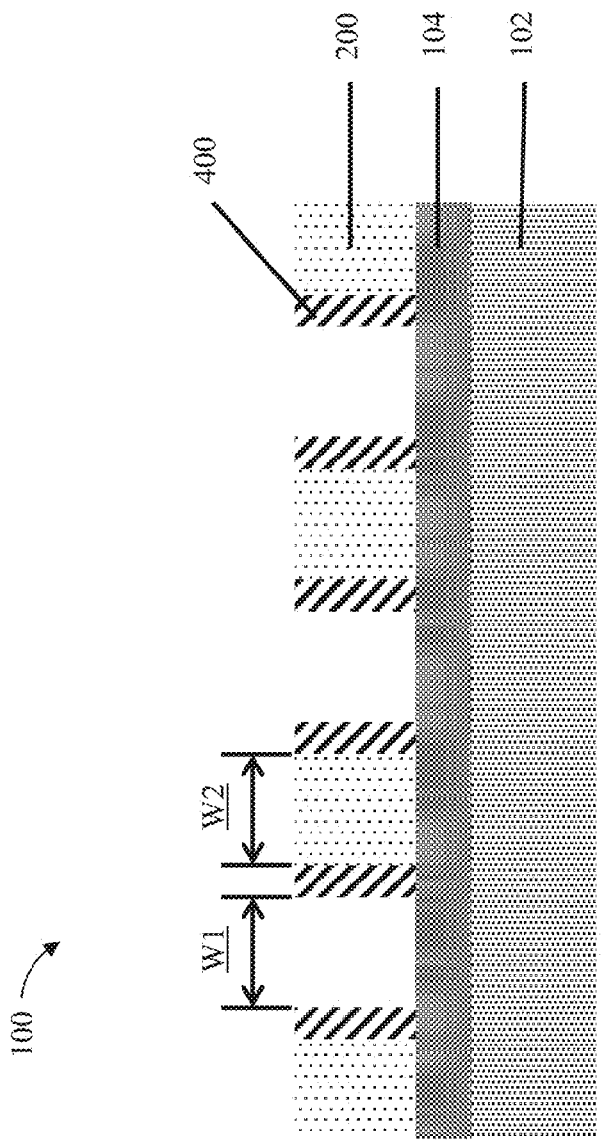
FIG. 4 depicts the cross-sectional view of the structure after etching the conformal spacer layer to form spacers adjacent to the sidewalls of the sacrificial mandrels according to one or more embodiments of the present invention.

FIG. 4 illustrates a cross-sectional view of the structure 100 after etching the conformal spacer layer 300 to form spacers 400 adjacent to the sidewalls of the sacrificial mandrels 200. The manner of etching the conformal spacer layer 300 is not meant to be particularly limited. In some embodiments, a RIE etch removes portions of the conformal spacer layer 300 to expose portions of the sacrificial mandrels 200 and hard mask layer 104. In some embodiments, the fin pitch, or fin spacing W1 between adjacent spacers 400 is the same as the width W2 of the sacrificial mandrels 200.

Figure 5:
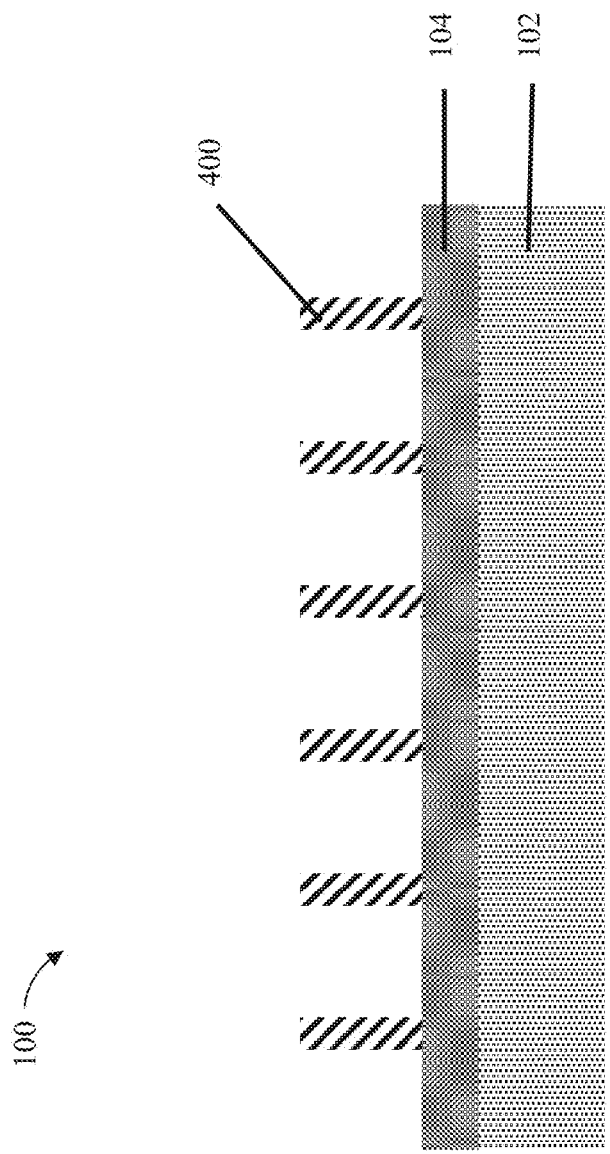
FIG. 5 depicts the cross-sectional view of the structure after removing the sacrificial mandrels according to one or more embodiments of the present invention.

FIG. 5 illustrates a cross-sectional view of the structure 100 after removing the sacrificial mandrels 200. The manner of removing the sacrificial mandrels 200 is not meant to be particularly limited. In some embodiments, the sacrificial mandrels 200 are removed by an etch selective to the spacers 400 and the hard mask layer 104. In still other embodiments, the sacrificial mandrels are of an ashable material removed using an ashing process. The ashing process includes highly selective oxygen-based plasma. In accordance with one embodiment, the ashing process removes the ashable sacrificial mandrels 200 with at least a 50:1 etch selectivity, or with an etch rate that is at least 50 times faster than the etch rate for the spacers 400. After removing the sacrificial mandrels 200, the sidewalls of the spacers 400 are treated with a precursor polymer (not depicted). The precursor polymer is selected such that the precursor polymer is preferentially attracted to a first polymer 700 (shown in FIG. 7), which will be described in greater detail later in this detailed description. In some embodiments the precursor polymer is hydroxyl-polystyrene (PS-OH). In still other embodiments, the fin pitch, or spacing between each adjacent spacer, is less than about 40 nm.

Figure 6:
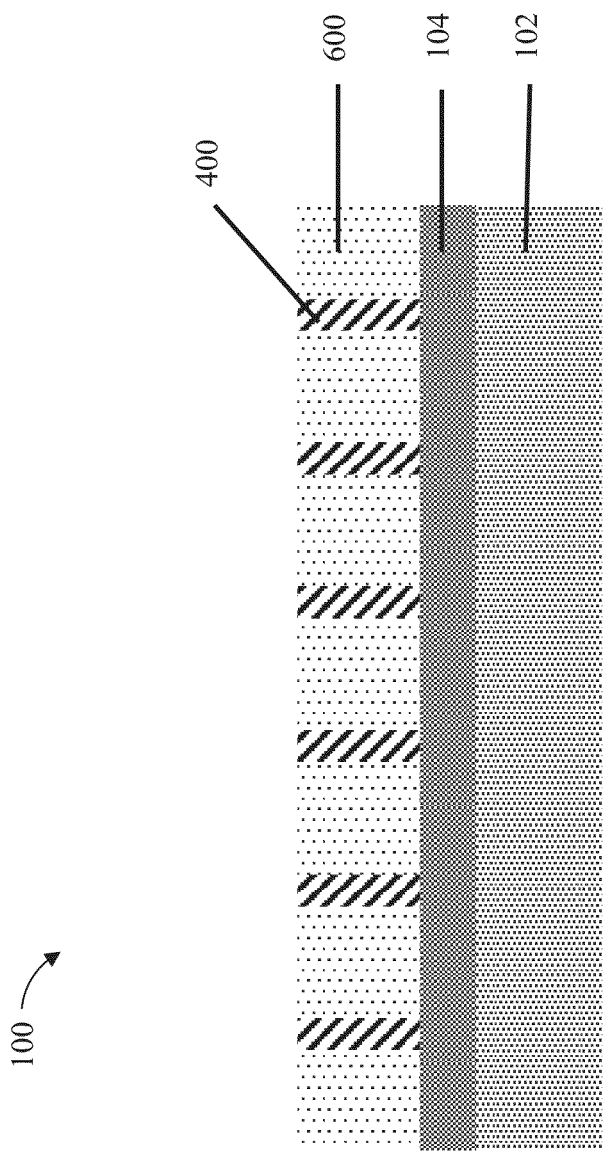
FIG. 6 depicts the cross-sectional view of the structure after coating the hard mask layer and spacers with a block copolymer according to one or more embodiments of the present invention.

FIG. 6 illustrates a cross-sectional view of the structure 100 after coating the hard mask layer 104 and spacers 400 with a block copolymer 600. The manner of depositing block copolymer 600 not meant to be particularly limited. In some embodiments, the block copolymer 600 is deposited using a spin-on coating process. Spin-on coating processes ensure that excess block copolymer 600 does not form on top of the spacers 400 (i.e., overburden). In still other embodiments, the block copolymer 600 is deposited using any suitable means, such as CVD, and a chemical-mechanical planarization (CMP) is used to remove the portion of the block copolymer (known as overburden) that extends above the top of the spacers 400.

Figure 7:
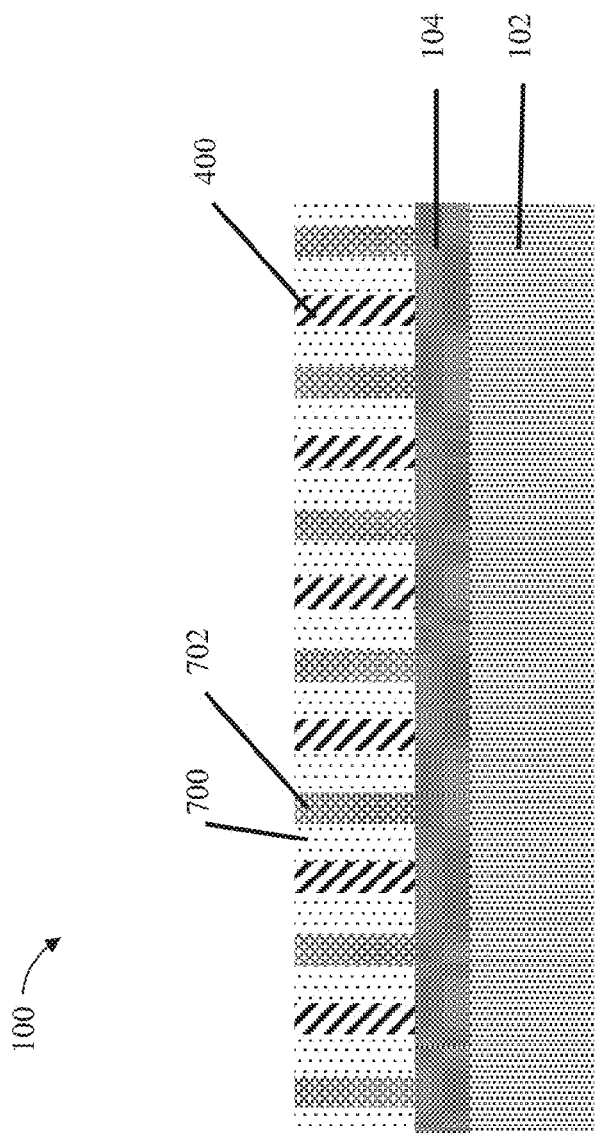
FIG. 7 depicts the cross-sectional view of the structure after an annealing process triggers a directed self-assembly (DSA) of the block copolymer into alternating regions of a first polymer and a second polymer according to one or more embodiments of the present invention.

FIG. 7 illustrates a cross-sectional view of the structure 100 after an annealing process triggers a directed self-assembly (DSA) of the block copolymer 600 into alternating regions of a first polymer 700 and a second polymer 702. During the annealing process the two blocks of block copolymer 600 self-assemble due to the preferential attraction of one block to the precursor polymer coating on the spacers 400. The efficacy of a DSA process depends on properties including the fin pitch, fin width, and the selected block copolymer. During DSA, the critical dimension (CD) of the polymers, also known as the DSA CD rectification effect, is determined by a guiding pattern CD (e.g., the edge-to-edge fin pitch), albeit having a smaller CD variation than the guiding pattern CD.

In some embodiments, the annealing process includes a nitrogen carrier gas at a temperature of at least 200, 245, or 290 degrees Celsius. The DSA of the block copolymer 600 is aided by the precursor polymer, which was used to pre-treat the sidewalls of the spacers 400, as previously described herein. In some embodiments the block copolymer 600 is polystyrene-b-poly(methyl methacrylate) (PS-b-PMMA), the first polymer 700 is polystyrene (PS), the second polymer 702 is poly(methyl-methacrylate) (PMMA), and the precursor polymer (not depicted) is hydroxyl-polystyrene (PS-OH).

There has been considerable effort in the development of patterning techniques using directed self-assembly (DSA) of block copolymer (BCP) thin films over the past decade. This effort has been largely driven by the ability of DSA techniques to enable patterning of features with sub-lithographic resolutions. Moreover, DSA processes involve fewer steps and BCP domain orientations are easier to control if the copolymers have similar free surface energies. However, most BCP systems which have blocks with similar surface energies also tend to have similar elemental and/or chemical composition, such as, for example, PS-b-PMMA systems. The elemental/chemical similarity between the blocks greatly limits the plasma etch contrast between BCP domains. As very high film thickness is not desirable for good BCP assembly control, the limited etch contrast combined with low film thickness places constraints on the pattern transfer process. Notwithstanding this limitation, a lamella forming BCP, such as PS-b-PMMA, can be selected because after self-assembly one the domains can be etched away to form line-space patterns which can be readily used for the patterning of gate and channel elements in transistors, lower metal lines and other patterning layers in semiconductor manufacturing.

Figure 8:
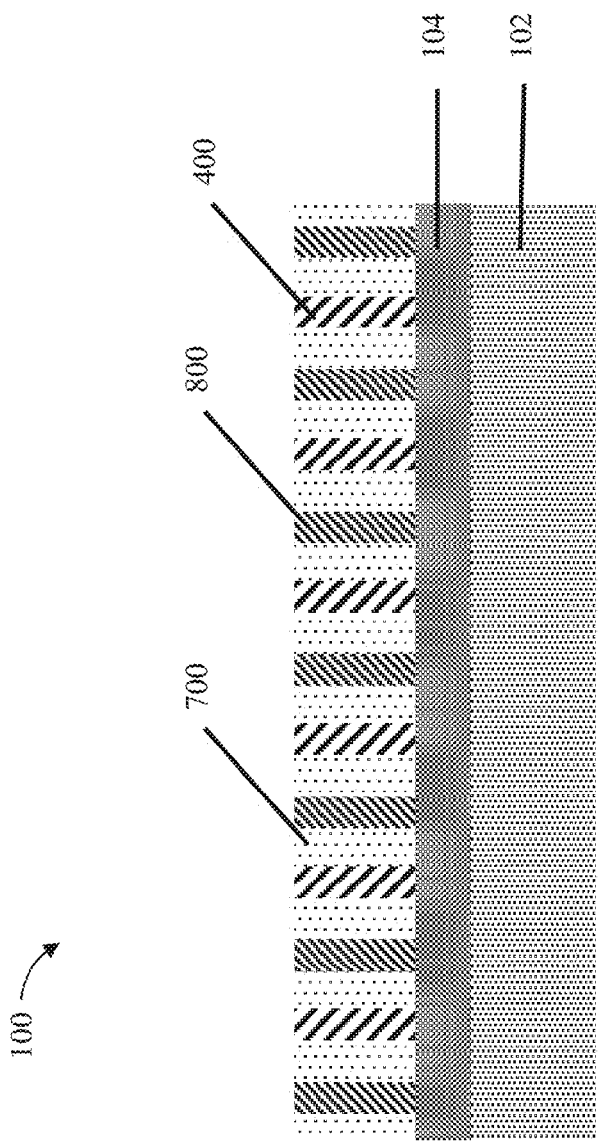
FIG. 8 depicts a cross-sectional view of the structure after a sequential infiltration synthesis (SIS) process infiltrates the second polymer with a metal oxide according to one or more embodiments of the present invention.

FIG. 8 illustrates a cross-sectional view of the structure 100 after a sequential infiltration synthesis (SIS) process infiltrates the second polymer 702 with a metallic material, such as, for example, a metal oxide 800. Sequential infiltration synthesis is a process for selectively hardening a copolymer of self-assembled BCP films. The copolymer is exposed to organometallic precursors and a subsequent reaction with oxidants to form metal oxides. Because metal oxides have greatly improved plasma etch resistance compared to the initial polymer blocks, this approach enables allows for relatively higher aspect ratio pattern transfer processes than would be possible without SIS processing. In one embodiment, the SIS process infiltrates the second polymer 702 (PMMA) in the self-assembled lamellar block copolymer 600 (PS-b-PMMA) with alumina ($Al_2O_3$).

Figure 9:
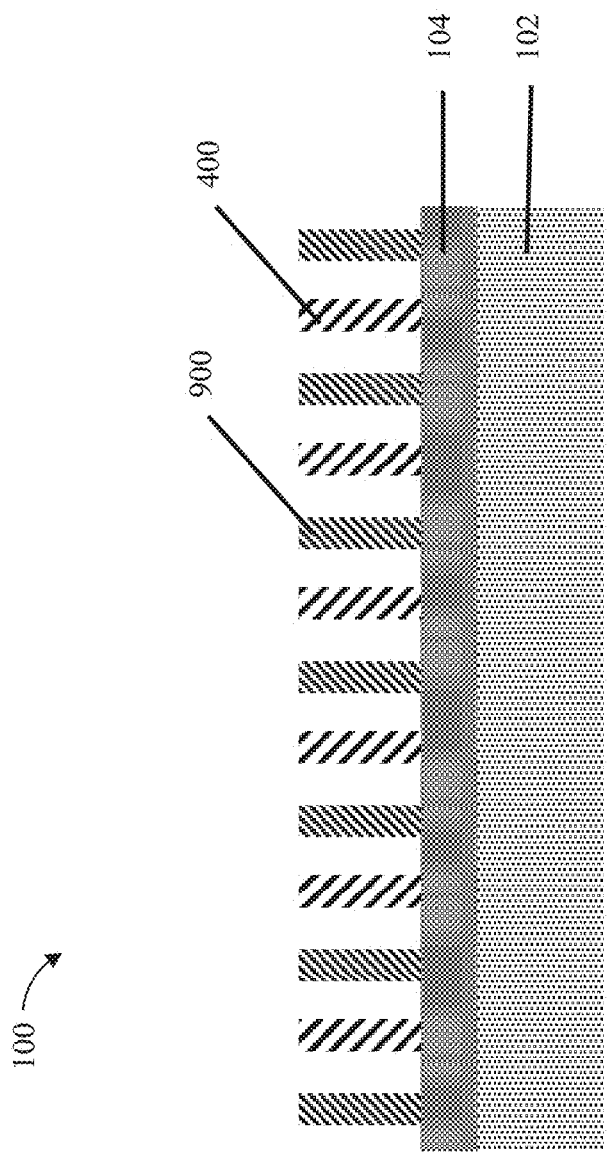
FIG. 9 depicts a cross-sectional view of the structure after removing the first polymer to form spacers from the metal oxide according to one or more embodiments of the present invention.

FIG. 9 illustrates a cross-sectional view of the structure 100 after removing the first polymer 700 to form spacers 900 from the metal oxide 800. The manner of removing the first polymer 700 is not meant to be particularly limited. In some embodiments, a RIE etch selective to the metal oxide 800, the spacers 400, and the hard mask layer 104 removes the first polymer 700. In still other embodiments, a wet etch removes the first polymer 700.

Figure 10:
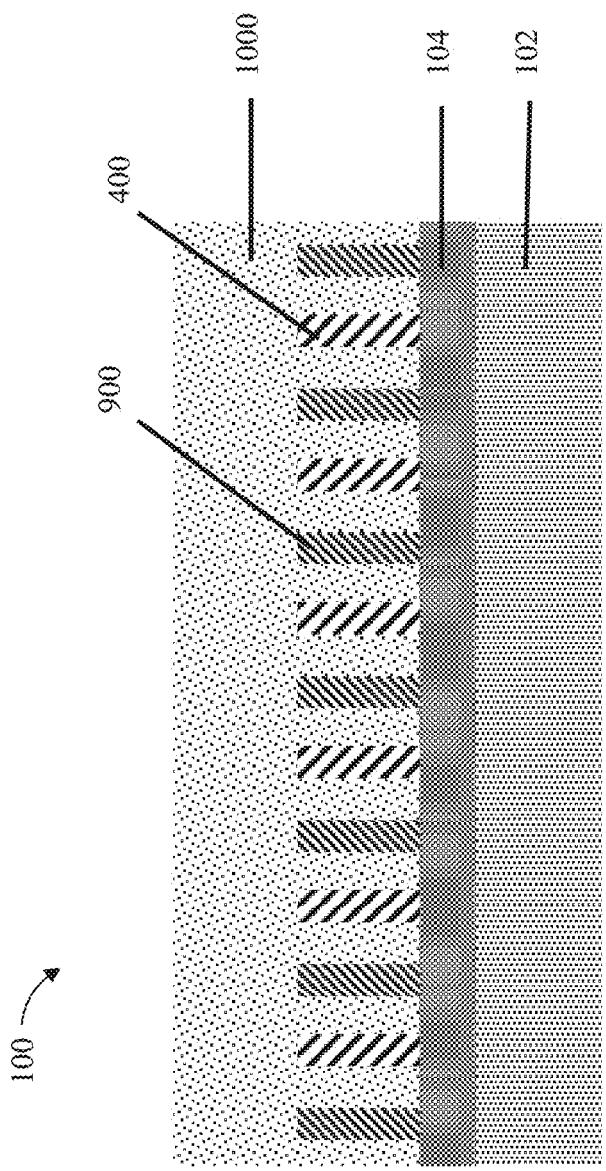
FIG. 10 depicts a cross-sectional view of the structure after forming a mask material layer on the spacers and the hard mask layer according to one or more embodiments of the present invention.

FIG. 10 illustrates a cross-sectional view of the structure 100 after forming a mask material layer 1000 on the spacers 400, the spacers 900, and the hard mask layer 104. Mask material layer 1000 can be a photoresist. The manner of forming mask material layer 1000 is not meant to be particularly limited. In some embodiments, mask material layer 1000 is deposited using a spin-on coating process.

Figure 11:
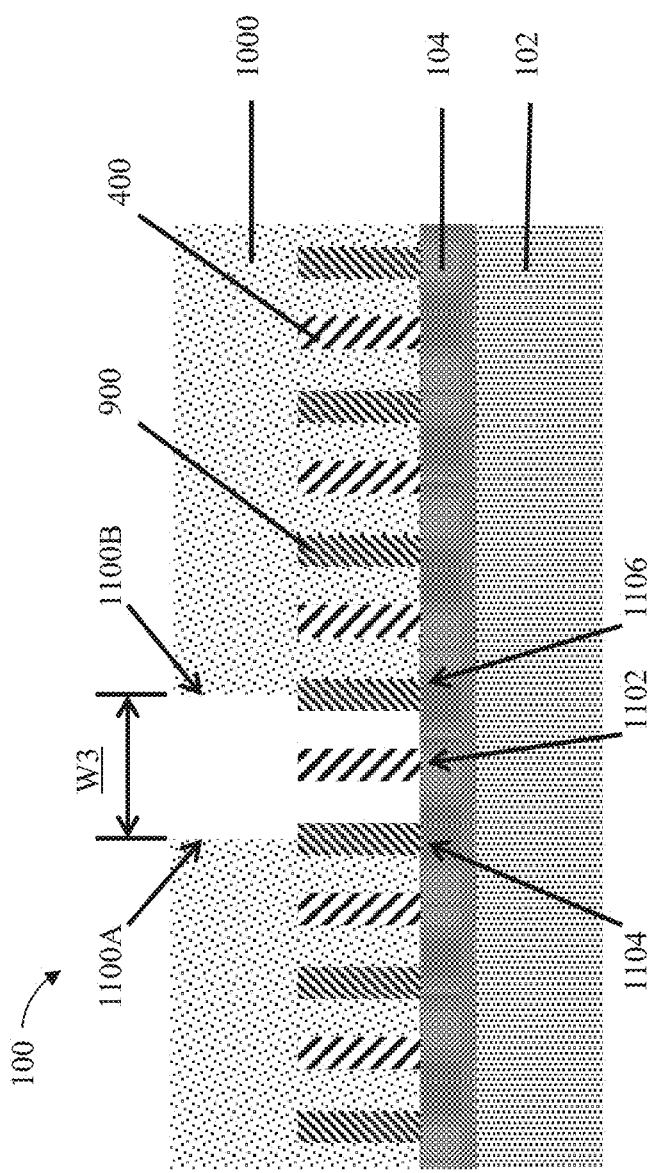
FIG. 11 depicts a cross-sectional view of the structure after opening the mask material layer selective to the spacers and the hard mask layer to pattern the mask material layer according to one or more embodiments of the present invention.

FIG. 11 illustrates a cross-sectional view of the structure 100 after opening the mask material layer 1000 selective to the spacers 400, the spacers 900, and the hard mask layer 104 to pattern the mask material layer 1000 (i.e., to form a patterned mask) using a photomask (not depicted). The opening can have a width W3, a first sidewall 1100A, and a second sidewall 1100B. Because the opening is selective to the spacers 400, the spacers 900, and the hard mask layer 104, the opening can be selectively positioned to overlay a single spacer 1102 of the spacers 400 (i.e., self-aligned to the single spacer 1102). The opening between sidewalls 1100A and 1100B in the mask material layer 1000 define a processing window for removing the single spacer 1102.

As discussed in detail previously, the overlay tolerances of available lithographic processes begin to limit the effective removal of a dummy fin as the fin pitch decreases in part because it is becoming increasingly difficult to precisely position the two photoresist sidewalls (i.e., the processing window) between adjacent fins. The sidewalls must be precisely positioned between the dummy fin and the next adjacent fin on either side of the dummy fin because the fins are made of the same material and have the same etching selectivity. If either sidewall of the photoresist contacts an adjacent fin the contacted fin will be exposed and removed or damaged during the etching process of the dummy fin.

In some embodiments of the present invention, a first material for the spacers 400 and a second material for the spacers 900, which alternate across the substrate, are selected such that the first and second materials have dissimilar etch rates with respect to an etch process. Thus, the spacers 400 are selective to the spacers 900. The alternating spacers having dissimilar etch rates form a two color hard mask. Consequently, an etch process selective to either the spacers 400 or the spacers 900 is possible. The availability of a selective spacer etch greatly widens the available processing window for removing a dummy fin, as the photoresist sidewalls can contact or even extend beyond the fins immediately adjacent to the dummy fin without risking damage to the adjacent fins during the subsequent etching of the dummy fin. The larger processing window available with a two color hard mask process provides a higher lithography tolerance than the relatively narrow processing window required for spacers having a single etch selectivity; protecting the adjacent fins from a larger misalignment of the sidewalls than was otherwise possible and allowing for the selective removal of a single dummy fin from a set of fins having a tight fin pitch. The larger processing window can remove a single dummy fin from a set of fins even when the fin pitch is under about 40 nm, or under about 20 nm.

In some embodiments, the first sidewall 1100A is positioned over a first spacer 1104 of the spacers 900, the first spacer 1104 of the spacers 900 adjacent to the single spacer 1102 of the spacers 400. In still other embodiments, the second sidewall 1100B is positioned over a second spacer 1106 of the spacers 900, the second spacer 1106 opposite to the first spacer 1104 of the spacers 900 and adjacent to the single spacer 1102 of the spacers 400. In some embodiments, the processing window for removing the single spacer 1102 of the spacers 400 extends on either side of the single spacer 1102 to the next adjacent spacer 900, thereby increasing the size of the available processing window while still protecting the remaining spacers 400 under the mask material layer 1000.

Figure 12:
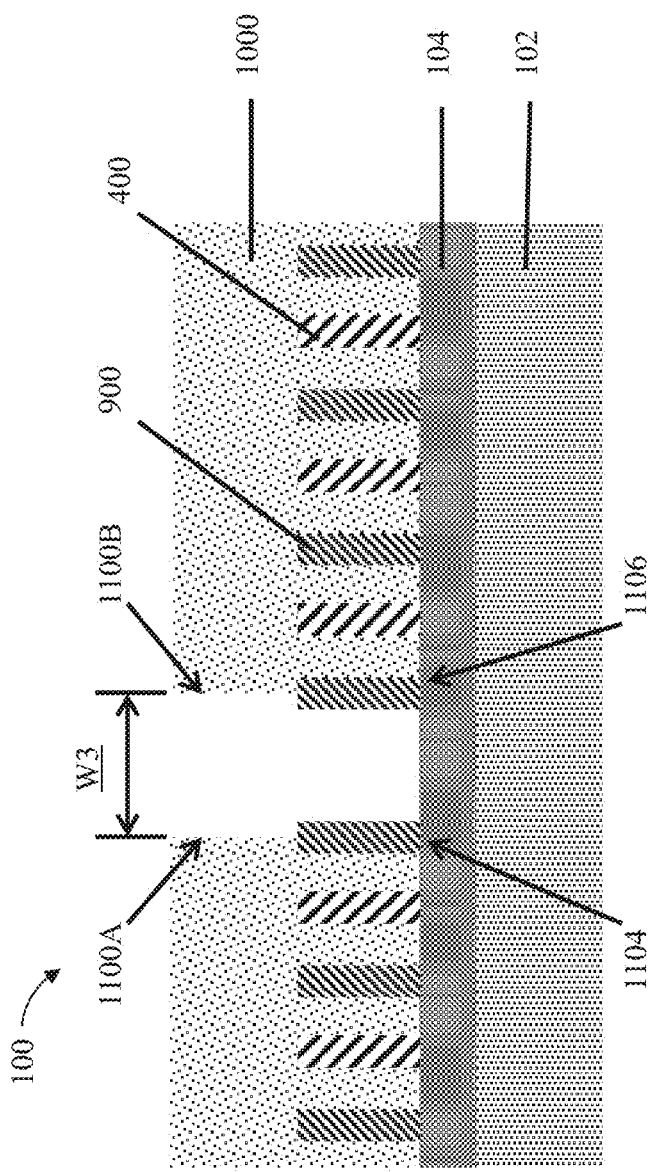
FIG. 12 depicts a cross-sectional view of the structure after removing the single spacer according to one or more embodiments of the present invention.

FIG. 12 illustrates a cross-sectional view of the structure 100 after removing the single spacer 1102 using an etch process. The manner of removing the single spacer 1102 is not meant to be particularly limited. In some embodiments, the single spacer 1102 is removed by an etch process, such as, for example, a wet or dry etch. In some embodiments, the etch process is a RIE etch selective to the spacers 900 and the hard mask layer 104. The etch process removes the first material (i.e., the material of the spacers 400) at a first etch rate and removes the second material (i.e., the material of the spacers 900) at a second etch rate. In some embodiments, the first etch rate is greater than the second etch rate. In some embodiments, the etch rate of the second element can be zero, or "effectively zero," such that the second element is not removed during the etch process even over long periods of time (i.e., a time after the first element has been completely removed).

Figure 13:
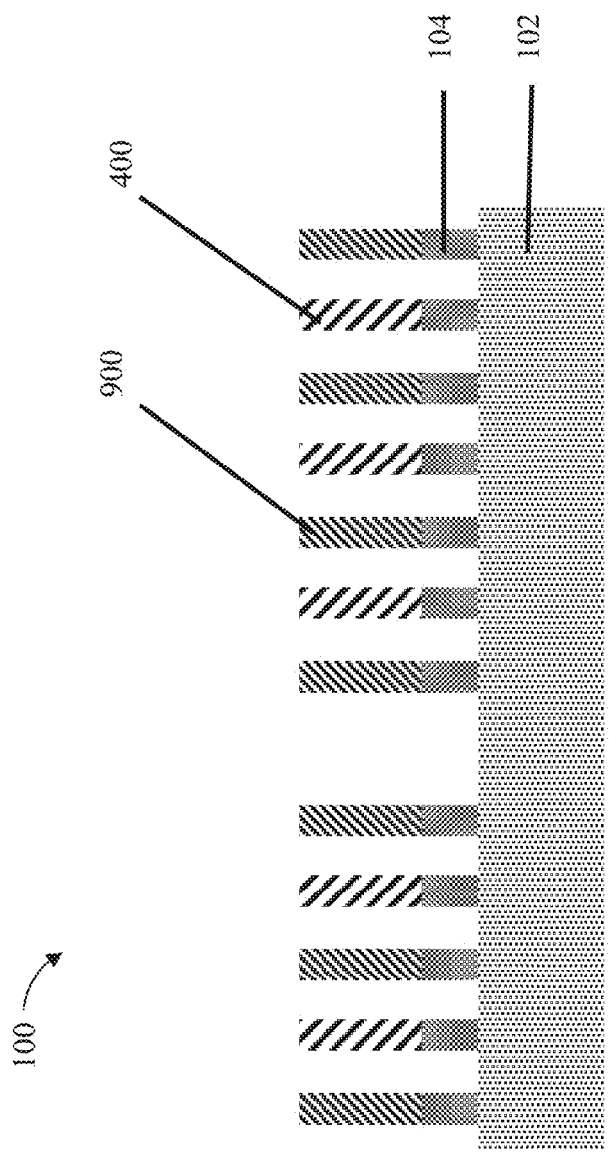
FIG. 13 depicts a cross-sectional view of the structure after removing the mask material layer according to one or more embodiments of the present invention.

FIG. 13 illustrates a cross-sectional view of the structure 100 after removing the mask material layer 1000 and portions of the hard mask layer 104 to expose portions of the substrate 102. The manner of removing the mask material layer 1000 and portions of the hard mask layer 104 is not meant to be particularly limited. In some embodiments, the mask material layer 1000 is stripped using an isotropic etch. In some embodiments, portions of the hard mask layer 104 are removed using a ME.

Figure 14:
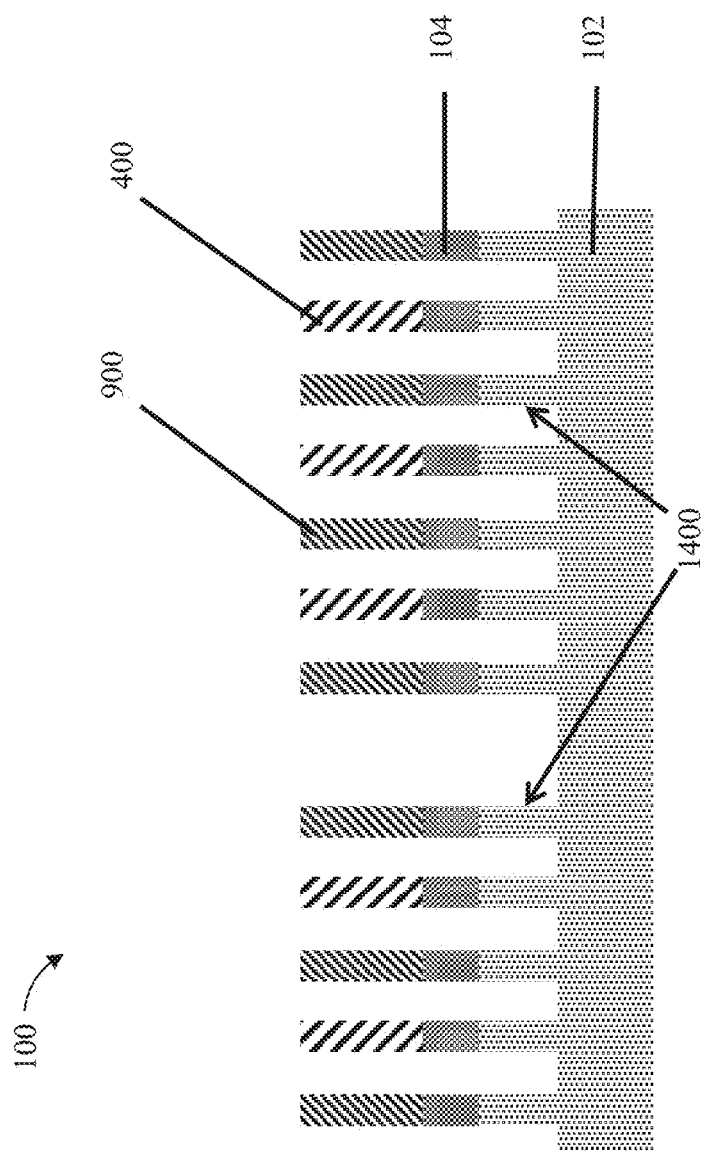
FIG. 14 depicts a cross-sectional view of the structure after etching the hard mask layer to expose portions of the substrate and removing exposed portions of the substrate to form a plurality of fins according to one or more embodiments of the present invention.

FIG. 14 illustrates a cross-sectional view of the structure 100 after removing exposed portions of the substrate 102 to form a plurality of fins 1400. In some embodiments, etch processes (either wet or dry) remove the hard mask layer 104, the spacers 400, and the spacers 900 from a top surface of each fin of the plurality of fins 1400 (not illustrated). In still other embodiments, a gate stack is formed over a channel region of a first fin and a second fin of the plurality of fins 1400 (not illustrated).

Figure 15:
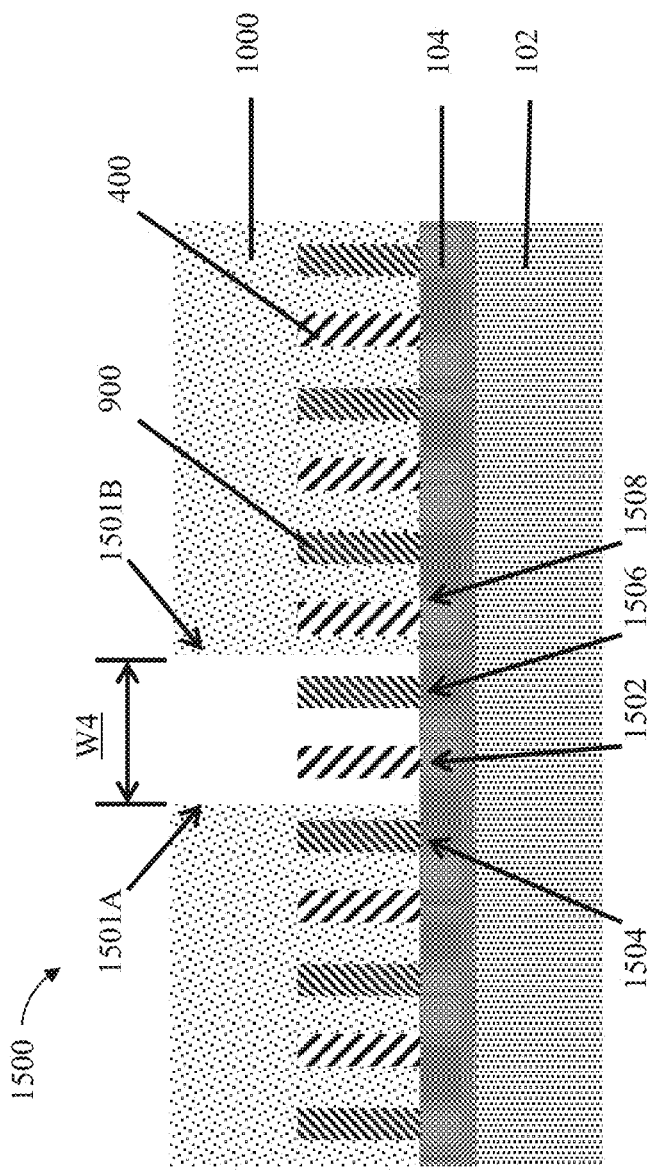
FIG. 15 depicts a cross-sectional view of a structure after opening the mask material layer selective to the spacers and the hard mask layer to pattern the mask material layer according to one or more embodiments of the present invention.

FIG. 15 illustrates a cross-sectional view of a structure 1500 after opening the mask material layer 1000 selective to the spacers 400, the spacers 900, and the hard mask layer 104 to pattern the mask material layer 1000 (i.e., to form a patterned mask) using a photomask (not depicted). The opening can have a width W4, a first sidewall 1501A, and a second sidewall 1501B.

In some embodiments, the first sidewall 1501A is positioned between a first spacer 1504 of the spacers 900 and the single spacer 1502 of the spacers 400. In still other embodiments, the second sidewall 1501B is positioned between a second spacer 1506 of the spacers 900 and a second spacer 1508 of the spacers 400, the second spacer 1506 opposite to the first spacer 1504 of the spacers 900, with respect to the single spacer 1502, and adjacent to the single spacer 1502 of the spacers 400 and the second spacer 1508 of the spacers 400. The single spacer 1502 and the second spacer 1506 are completely exposed within the opening between the first sidewall 1501A and the second sidewall 1501B.

Figure 16:
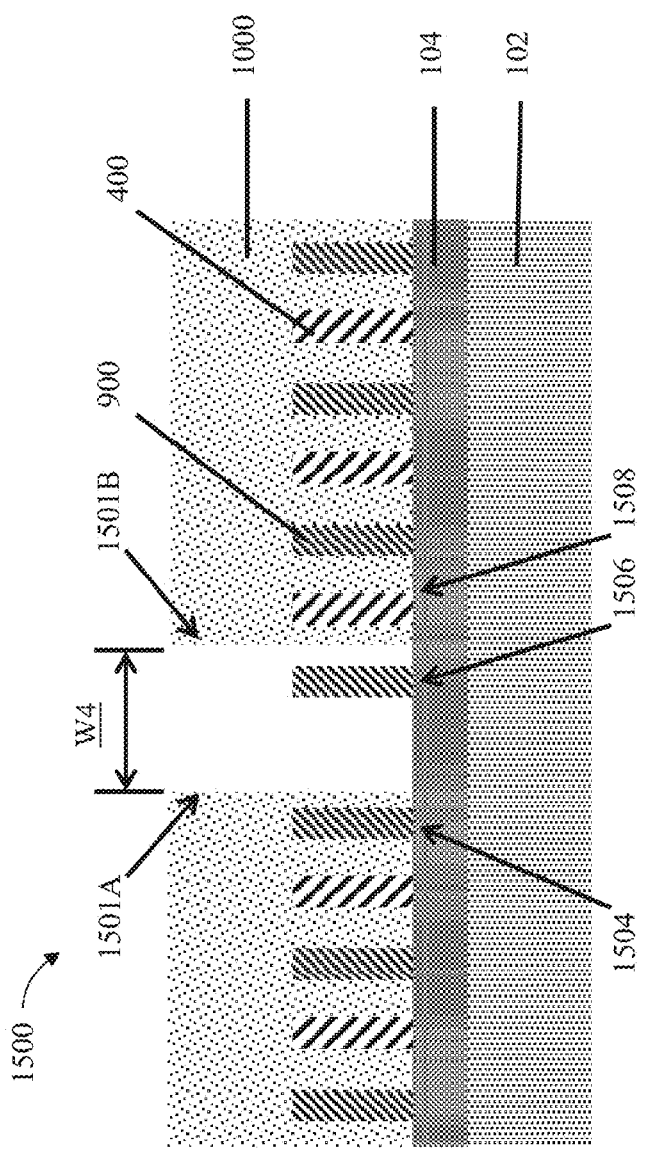
FIG. 16 depicts a cross-sectional view of the structure after removing the single spacer according to one or more embodiments of the present invention.

FIG. 16 illustrates a cross-sectional view of the structure 1500 after removing the single spacer 1502. The manner of removing the single spacer 1502 is not meant to be particularly limited. In some embodiments, the single spacer 1502 is removed by a RIE etch selective to the spacers 900 and the hard mask layer 104.

Figure 17:
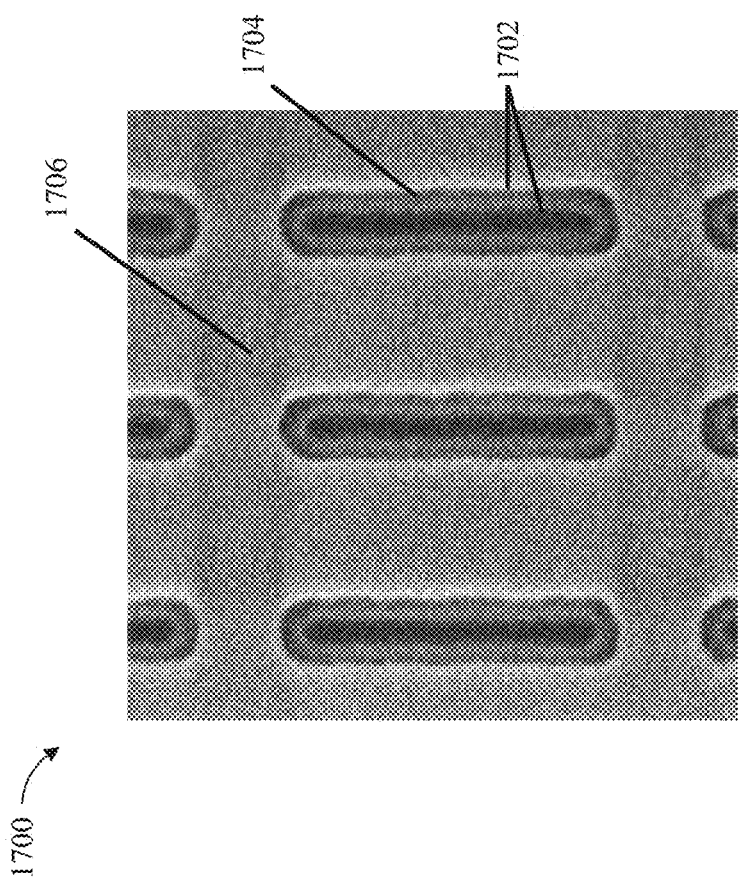
FIG. 17 depicts a top-down view of a directed self-assembly (DSA) critical dimension (CD) rectification effect in accordance with one or more embodiments of the present invention.

FIG. 17 illustrates a top-down view of a directed self-assembly (DSA) critical dimension (CD) rectification effect in accordance with one or more embodiments of the present invention. Specifically, the structure 1700 demonstrates a DSA of a block copolymer into alternating portions of a first polymer 1702 and a second polymer 1704 in a first dielectric layer 1706. The CD of the second polymer 1704 (e.g., PMMA in some embodiments) is determined by the CD and aspect ratio (height/width) of the guiding pattern. In some embodiments, the aspect ratio is 1.5.

Figure 18:
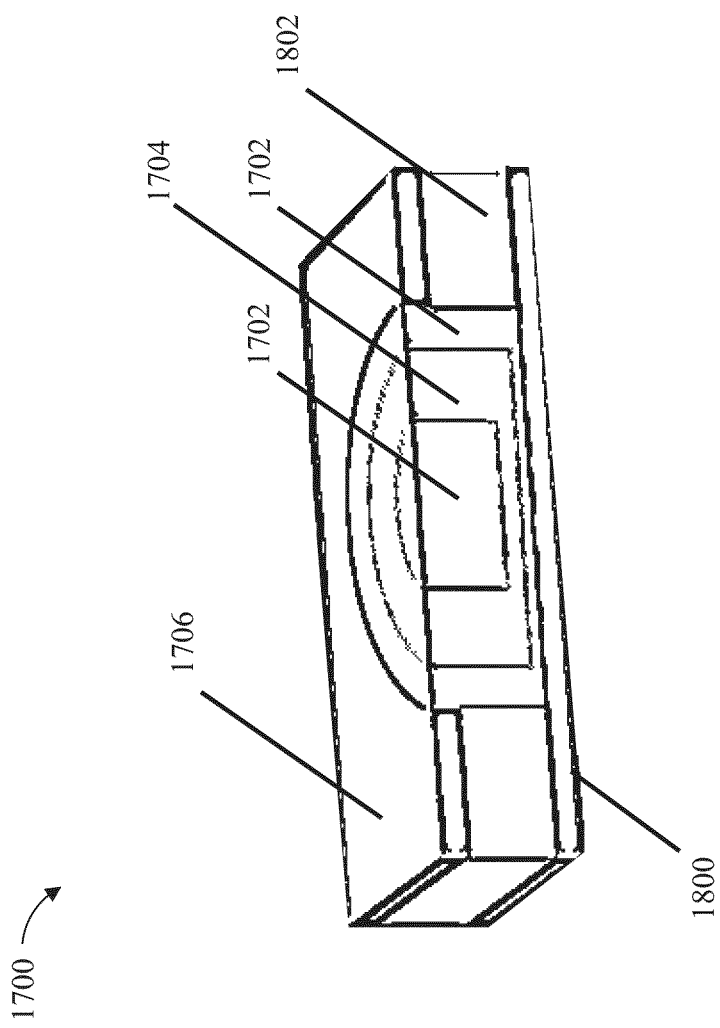
FIG. 18 depicts a three dimensional cross-sectional view of the structure of FIG. 17.

FIG. 18 illustrates a three dimensional cross-sectional view of the structure 1700. The alternating first polymer 1702 and second polymer 1704 are positioned within the first dielectric layer 1706, a second dielectric layer 1800, and a spacing layer 1802.

Figure 19:
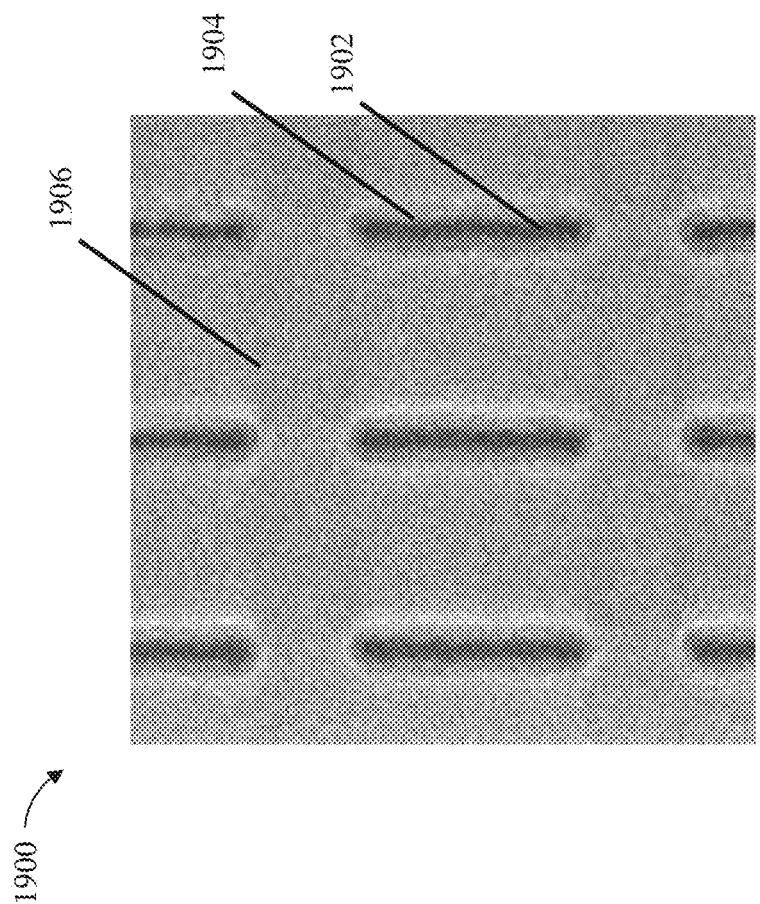
FIG. 19 depicts a top-down view of a directed self-assembly (DSA) critical dimension (CD) rectification effect in accordance with one or more embodiments of the present invention.

FIG. 19 illustrates a top-down view of a directed self-assembly (DSA) critical dimension (CD) rectification effect in accordance with one or more embodiments of the present invention. Specifically, the structure 1700 demonstrates a DSA of a block copolymer into alternating portions of a first polymer 1902 and a second polymer 1904 in a first dielectric layer 1906. The CD of the second polymer 1904 (e.g., PMMA in some embodiments) is determined by the CD and aspect ratio (height/width) of the guiding pattern.

Figure 20:
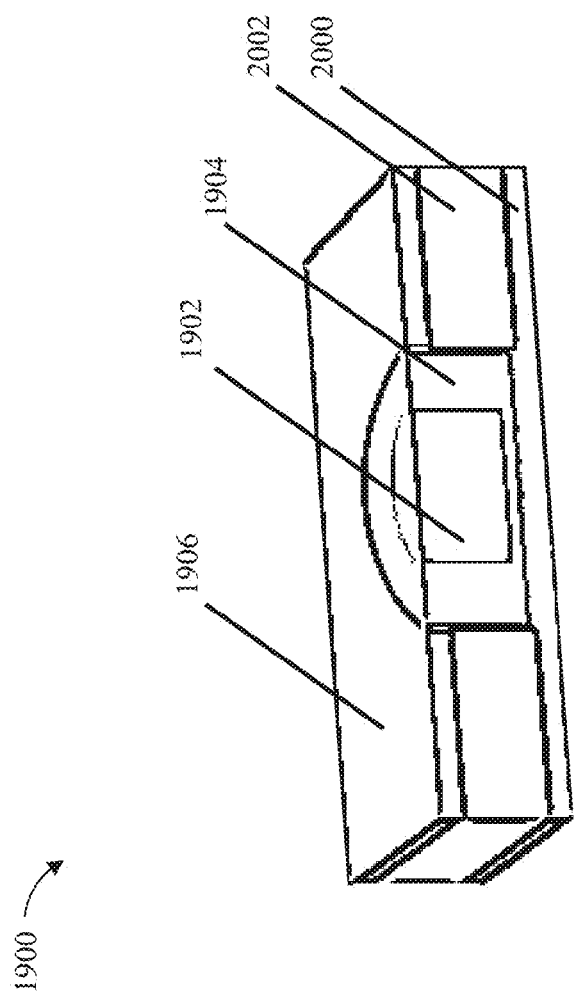
FIG. 20 depicts a three dimensional cross-sectional view of the structure of FIG. 19.

FIG. 20 illustrates a three dimensional cross-sectional view of the structure 1900. The alternating first polymer 1902 and second polymer 1904 are positioned within the first dielectric layer 1906, a second dielectric layer 2000, and a spacing layer 2002.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a first spacer comprising a first material on a substrate;
    depositing a block copolymer on a sidewall of the first spacer, the block copolymer assembling into alternating regions of a first polymer and a second polymer after a directed self-assembly (DSA);
    removing the first polymer such that the second polymer defines a second spacer comprising a second material on the substrate, the second spacer adjacent to the first spacer; and
    applying an etch process to the first spacer and the second spacer;
    wherein the etch process removes the first spacer at a first etch rate;
    wherein the etch process removes the second spacer at a second etch rate;
    wherein the first etch rate is different than the second etch rate;
    wherein forming the first spacer further comprises;
    forming a sacrificial material layer overlying the substrate;
    depositing a hard mask layer on top of the substrate, the hard mask layer between the substrate and the sacrificial material layer;
    removing portions of the sacrificial material layer to form a sacrificial mandrel, the sacrificial mandrel having sidewalls;
    forming the first spacer adjacent to the sidewalls of the sacrificial mandrel; and removing the sacrificial mandrel.

2. The method of claim 1, further comprising: depositing a conformal spacer layer over the mandrel; and removing portions of the conformal spacer layer, the remaining portions of the conformal spacer layer defining the first spacer.

3. The method of claim 1, wherein the sacrificial material layer comprises a silicon nitride (SiN), and wherein the hard mask layer is amorphous carbon (aC).

4. The method of claim 1, further comprising:
    treating the sidewall of the first spacer with a precursor polymer; and
    infiltrating the second polymer with a metal oxide using a sequential infiltration synthesis (SIS) process.

5. The method of claim 4, wherein the DSA operation further comprises annealing the block copolymer using nitrogen carrier gas at a temperature of 200 to 290 degrees Celsius.

6. The method of claim 4, wherein the block copolymer is polystyrene-b-poly(methyl methacrylate) (PS-b-PMMA), the first polymer is PS, the second polymer is PMMA, and the precursor polymer is PS-OH, and wherein infiltrating the PMMA with a metal oxide comprises converting the PMMA to aluminum ($Al_2O_3$).

7. The method of claim 1, further comprising:
    forming a first set of spacers of the first material on the substrate;
    forming a second set of spacers of the second material on the substrate;
    forming a mask material layer on the first set of spacers and on the second set of spacers;
    forming an opening in the mask material layer selective to the first material, the second material, and the hard mask layer, the opening having first and second sidewalls;
    positioning the first sidewall of the opening over a first spacer of the second set of spacers, the first spacer of the second set of spacers adjacent to the first spacer of the first set of spacers;
    positioning the second sidewall of the opening over a second spacer of the second set of spacers, the second spacer of the second set of spacers opposite to the first spacer of the second set of spacers and adjacent to the first spacer of the first set of spacers; and
    removing the first spacer of the first set of spacers selective to the second material and the hard mask layer.

8. The method of claim 7, further comprising:
    etching the hard mask layer to expose portions of the substrate;
    removing exposed portions of the substrate to form a first fin and a second fin; and forming a gate stack over a channel region of the first fin and the second fin.

9. A method for forming a semiconductor device, the method comprising:
   forming a first spacer, a second spacer, and a third spacer on a substrate, the first spacer and the third spacer comprising a first material and the second spacer comprising a second material, the second spacer arranged between the first spacer and the third spacer;
   applying an etch process to the first spacer, the second spacer, and the third spacer;
   wherein the etch process removes the first spacer and the third spacer at a first etch rate;
   wherein the etch process removes the second spacer at a second etch rate;
   wherein the first etch rate is different than the second etch rate;
   wherein the etch process removes the second spacer to expose a portion of the substrate.

10. The method of claim 9, wherein forming the first and third spacers includes:
    forming a sacrificial mandrel having a first and a second sidewall on a substrate;
    forming the first spacer adjacent to the first sidewall of the sacrificial mandrel;
    forming the second spacer adjacent to the second sidewall of the sacrificial mandrel; and
    removing the sacrificial mandrel to expose portions of the substrate.

11. The method of claim 9, wherein forming the second spacer includes:
    depositing a block copolymer layer adjacent to the spacers on the substrate;
    annealing to form a first material region and a second material region in the block copolymer layer;
    performing an infiltration process such the second material region includes a metallic material; and
    removing the first material region.

12. The method of claim 9, wherein the first material and the second material are not the same material.

13. The method of claim 9, further comprising:
    forming a mask material layer on the three spacers;
    forming an opening in the mask material layer, the opening having first and second sidewall s;
    positioning the first sidewall between the first spacer and the second spacer; and
    positioning the second sidewall over the substrate on a first side of the third spacer furthest from the second spacer, such that the opening extends beyond the first side and a second side of the third spacer;
    wherein the opening is formed selective to the first material, the second material, and the substrate;
    wherein removing the second spacer comprises an oxide etch selective to the first material and the substrate.

* * * * *